United States Patent
Canegallo et al.

(10) Patent No.: US 9,001,521 B2
(45) Date of Patent: Apr. 7, 2015

(54) SUBSTRATE ASSEMBLY PROVIDED WITH CAPACITIVE INTERCONNECTIONS, AND MANUFACTURING METHOD THEREOF

(75) Inventors: Roberto Canegallo, Rimini (IT); Mauro Scandiuzzo, Torrazza di Cambiago (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 168 days.

(21) Appl. No.: 13/334,084

(22) Filed: Dec. 22, 2011

(65) Prior Publication Data
US 2012/0170237 A1    Jul. 5, 2012

(30) Foreign Application Priority Data
Dec. 29, 2010    (IT) ............... TO2010A1079

(51) Int. Cl.
*H05K 7/10* (2006.01)
*H01L 23/48* (2006.01)
(Continued)

(52) U.S. Cl.
CPC ............. *H01L 23/48* (2013.01); *H01L 23/5223* (2013.01); *H01L 23/642* (2013.01);
(Continued)

(58) Field of Classification Search
CPC ........... H01L 2924/00013; H01L 2924/00014; H01L 2224/13111; H01L 2224/13116; H01L 2224/13144; H01L 2224/13124; H01L 2224/13099; H01L 2224/13599
USPC ................. 361/736, 748, 761, 764, 760, 767; 174/250, 255, 260, 261; 257/306, 308, 257/310–315; 29/830
See application file for complete search history.

(56) References Cited

U.S. PATENT DOCUMENTS

| | | | |
|---|---|---|---|
| 4,970,571 A | 11/1990 | Yamakawa et al. | |
| 5,477,933 A | 12/1995 | Nguyen | |

(Continued)

FOREIGN PATENT DOCUMENTS

| | | |
|---|---|---|
| EP | 1359618 A2 | 11/2003 |
| EP | 2341626 A2 | 7/2011 |

OTHER PUBLICATIONS

Gabara T.J., et al, *Capacitive Coupling and Quantized Feedback Applied to Conventional CMOS Technology;* IEEE Journal of Solid-State Circuits, vol. 32, No. 3, Mar. 1997, pp. 419-427.

(Continued)

*Primary Examiner* — Yuriy Semenenko
(74) *Attorney, Agent, or Firm* — Allen, Dyer, Doppelt, Milbrath & Gilchrist, P.A.

(57) ABSTRACT

An assembly including: a first substrate having a first surface and housing a first electrical-interconnection element and a second electrical-interconnection element in a position corresponding to the first surface; a second substrate having a second surface, housing a third electrical-interconnection element and a fourth electrical-interconnection element in a position corresponding to the second surface, and provided with a dielectric layer extending on top of the third interconnection element; and a first bump and a second bump made of conductive material, extending between the first electrical-interconnection element and the third electrical-interconnection element and, respectively, between the second electrical-interconnection element and the fourth electrical-interconnection element, at least partially aligned to the respective electrical-interconnection elements, the first bump being ohmically coupled to the first interconnection element and capacitively coupled to the third interconnection element, and the second bump being ohmically coupled to the second interconnection element and to the fourth interconnection element.

24 Claims, 5 Drawing Sheets

(51) Int. Cl.
  *H01L 23/64*   (2006.01)
  *H01L 25/065*  (2006.01)
  *H01L 25/10*   (2006.01)
  *H01L 25/00*   (2006.01)
  *H05K 1/02*    (2006.01)
  *H01L 23/522*      (2006.01)
  *H01L 23/00*       (2006.01)
  *H05K 3/34*        (2006.01)

(52) U.S. Cl.
  CPC ........ *H01L25/0652* (2013.01); *H01L 25/0657* (2013.01); *H01L 25/105* (2013.01); *H01L 25/50* (2013.01); *H01L 2224/16145* (2013.01); *H01L 2224/32145* (2013.01); *H01L 2224/48091* (2013.01); *H01L 2224/48227* (2013.01); *H01L 2225/06513* (2013.01); *H01L 2924/14* (2013.01); *H01L 2924/15192* (2013.01); *H01L 2924/19015* (2013.01); *H01L 2924/19041* (2013.01); *H01L 2224/17104* (2013.01); *H01L 24/48* (2013.01); *H05K 1/0239* (2013.01); *H05K 3/3436* (2013.01); *H01L 2224/13111* (2013.01); *H01L 2224/13116* (2013.01); *H01L 2224/13124* (2013.01); *H01L 2224/13144* (2013.01); *H01L 2224/13147* (2013.01); *H01L 2224/1403* (2013.01); *H01L 2224/1703* (2013.01); *H01L 2224/81815* (2013.01); *H01L 2924/00013* (2013.01); *H01L 2924/01079* (2013.01); *H01L 2224/73207* (2013.01); *H01L 2225/06531* (2013.01); *H01L 2225/1023* (2013.01); *H01L 2225/1058* (2013.01)

(56) References Cited

U.S. PATENT DOCUMENTS

| | | | |
|---|---|---|---|
| 6,005,777 | A | 12/1999 | Bloom et al. |
| 6,496,355 | B1 | 12/2002 | Galvagni et al. |
| 6,600,325 | B2 | 7/2003 | Coates et al. |
| 6,885,202 | B2 | 4/2005 | Slupsky |
| 6,927,490 | B2 | 8/2005 | Franzon et al. |
| 7,181,663 | B2 | 2/2007 | Hildebrant |
| 7,319,431 | B2 * | 1/2008 | Jeon et al. ............. 343/700 MS |
| 7,821,293 | B2 | 10/2010 | Fazzi et al. |
| 8,102,663 | B2 * | 1/2012 | Cunningham et al. ........ 361/760 |
| 2002/0003304 | A1 * | 1/2002 | Matsunaga et al. ........... 257/758 |
| 2004/0178819 | A1 * | 9/2004 | New ............................... 326/40 |
| 2008/0225987 | A1 * | 9/2008 | Fazzi et al. .................... 375/316 |
| 2009/0168391 | A1 * | 7/2009 | Saitou et al. .................. 361/820 |
| 2009/0189745 | A1 | 7/2009 | Nakashiba |
| 2011/0171906 | A1 | 7/2011 | Canegallo et al. |

OTHER PUBLICATIONS

Luo, L. et al, *3 Gb/s AC Coupled Chip-to-Chip Communication Using a Low Swing Pulse Receiver*; IEEE Journal of Solid-State Circuits, vol. 41, No. 1, Jan. 2006, pp. 287-296.

Italian Search Report and Written Opinion dated Sep. 6, 2011 from corresponding Italian Application No. TO2010A001079.

* cited by examiner

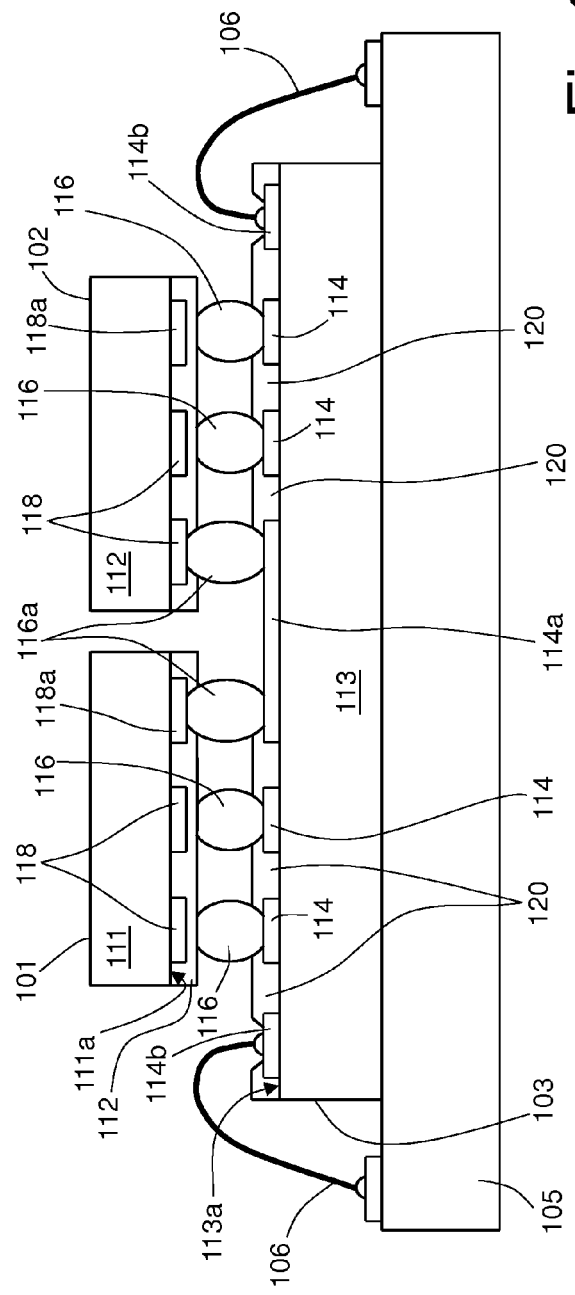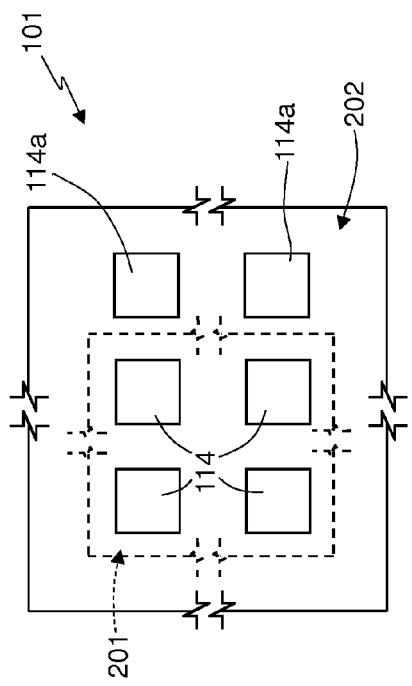

SUBSTRATE ASSEMBLY PROVIDED WITH CAPACITIVE INTERCONNECTIONS, AND MANUFACTURING METHOD THEREOF

CROSS REFERENCE TO RELATED APPLICATIONS

This application claims the priority benefit of Italian patent application number TO2010A001079, filed on Dec. 29, 2010, entitled SUBSTRATE ASSEMBLY PROVIDED WITH CAPACITIVE INTERCONNECTIONS, AND MANUFACTURING METHOD THEREOF, which is hereby incorporated by reference to the maximum extent allowable by law.

BACKGROUND

1. Technical Field

Embodiments relate to a substrate assembly comprising capacitive interconnections, and to a manufacturing method thereof.

2. Discussion of the Related Art

It is known to provide electrical connections of an ohmic type between a plurality of chips and/or between chips and a substrate. Said connections envisage the formation of protuberances or bumps, in particular solder bumps or pillar bumps, extending from respective facing portions of the chips and of the substrate. The electrical connections using bumps present numerous advantages as compared to electrical connections using wires (wire bonding), amongst which the possibility of enabling a considerable saving of area.

For example, U.S. Pat. No. 5,477,933 describes an electronic device comprising a chip connected to a substrate using a plurality of bumps.

Each bump, for example made of Au—Ge and/or Pb—Sn, is arranged in direct electrical contact with respective connection regions formed on respective facing surfaces of the chip and of the substrate, and in this way forms a conductive interconnection.

However, with the increase in the factor of integration of electronic devices, in the last few years it has become increasingly difficult to provide a sufficient amount of high-performance interconnections, which are in particular able to transfer both power signals and information signals, above all high-frequency signals (for example, in the case of RFID devices, devices functioning at radiofrequency, etc.). To overcome these difficulties, devices have been proposed the interconnections of which use a coupling of a capacitive and/or inductive type. In this case, the ohmic connections used for transfer of information signals are replaced by capacitive connections, which enable an efficient transfer of AC signals. A capacitive connection can be made by forming conductive pads on the surfaces of the chips that are to be coupled, and then by arranging the chips so that the respective conductive pads face one another to form a capacitor. It is evident that, in order to maximize the performance, the distance between facing conductive pads should be controlled in a precise, reliable, and repeatable way. Furthermore, also the alignment between conductive pads that are to communicate should be controlled.

To solve these problems, document No. US 2005/0046037 describes a first substrate and a second substrate provided with respective conductive pads configured for capacitive coupling. The first substrate moreover includes a recess in which a bump (in particular, a solder bump) is formed. The recess and the bumps are configured so that, when the second substrate is brought up to the first substrate coming into contact with the bump, all the conductive pads are separated from one another by a predetermined distance, in any case less than the thickness of the bump.

With reference to the capacitive interconnections described in document No. US 2005/0046037, the distance between the conductive pads of the facing substrates is determined jointly by the thickness of the bumps and by the depth of the recesses in which the bumps are formed. Possible process spread or non-uniformity of the manufacturing steps can lead to formation, on one the same substrate, of recesses having non-uniform depths and/or bumps having non-uniform thicknesses. Furthermore, to enable a sufficient degree of mechanical stability and support between coupled substrates, it may be necessary to form the bumps in a number much higher than what is effectively necessary for the transfer of information signals between substrates. In particular, in the case where the transfer of information signals were effected exclusively using the capacitive coupling between conductive pads, all the bumps would have the sole function of support and separation between conductive pads.

This results in a considerable waste of area of the substrates used, moreover complicating the manufacturing process thereof and increasing the costs thereof on account of the need to dig the substrate in a plurality of portions for providing the recesses in which the bumps are formed.

SUMMARY

An embodiment a substrate assembly comprising capacitive interconnections, and a corresponding manufacturing method that will be able to overcome at least some problems of the known art.

According to embodiments, a substrate assembly comprising capacitive interconnections, and a corresponding manufacturing method are provided, as defined in the annexed claims.

According to one embodiment, there is provided, an assembly comprising, a first substrate, having a first surface, housing a first electrical-interconnection element and a second electrical-interconnection element at the first surface; a second substrate, having a second surface, housing a third electrical-interconnection element and a fourth electrical-interconnection element at the second surface, and provided with a dielectric layer extending on top of the third electrical-interconnection element; a first coupling element of conductive material, extending between the first electrical-interconnection element and the third electrical-interconnection element and at least partially aligned to the first electrical-interconnection element and to the third electrical-interconnection element; and a second coupling element of conductive material, extending between the second electrical-interconnection element and the fourth electrical-interconnection element, at least partially aligned to the second and to the fourth electrical-interconnection elements, the first coupling element being ohmically coupled to the first electrical-interconnection element and capacitively coupled to the third electrical-interconnection element, and the second coupling element being ohmically coupled to the second electrical-interconnection element and to the fourth electrical-interconnection element.

According to an embodiment, the first coupling element is arranged in contact with the first electrical-interconnection element and with a portion of the dielectric layer facing the third electrical-interconnection element.

According to an embodiment, the first coupling element and the second coupling element are bumps, in particular solder bumps or pillar bumps.

According to an embodiment, wherein the first, second, third, and fourth electrical-interconnection elements are pads of conductive material.

According to an embodiment, the first substrate houses a first integrated circuit connected to the first electrical-interconnection element, the second substrate houses a second integrated circuit connected to the third electrical-interconnection element, the first and second integrated circuits being capacitively coupled together by means of the first electrical-interconnection element, the first coupling element, and the third electrical-interconnection element.

According to an embodiment, the first integrated circuit includes a first controller configured for processing information data, and a first transceiver circuit connecting the first controller to the first electrical-interconnection element; and the second integrated circuit includes a second controller configured for processing information data, and a second transceiver circuit connecting the second controller to the third electrical-interconnection element.

According to an embodiment, the first and second transceiver circuits are formed in integrated form in the respective first and second substrates.

According to an embodiment, the first and second transceiver circuits are configured to enable communication in transmission and/or reception of information data in digital or analog format between the first and the second integrated circuits through the first electrical-interconnection element, the first coupling element, and the third electrical-interconnection element.

According to an embodiment, the first and second transceiver circuits are capacitive-coupling transceivers.

According to an embodiment, the second electrical-interconnection element is directly coupled to the first controller, and the fourth electrical-interconnection element is directly coupled to the second controller.

According to an embodiment, the first electrical-interconnection element and the first coupling element form a first capacitor plate, and the third electrical-interconnection element forms a second capacitor plate, the dielectric layer forming a dielectric disposed between the first and second capacitor plates.

According to an embodiment, the third electrical-interconnection element, the second coupling element, and the fourth electrical-interconnection element are configured for transferring a DC signal between the first and second substrates.

According to an embodiment, the first substrate further comprises a first plurality of electrical-interconnection elements housed at the first surface; the second substrate further comprises a second plurality of electrical-interconnection elements housed at the second surface, the dielectric layer extending on top of said second plurality of electrical-interconnection elements, said assembly further comprising a first plurality of coupling elements, each coupling element extending between an electrical-interconnection element and an electrical-interconnection element, and being ohmically coupled to the respective electrical-interconnection element and capacitively coupled to the respective electrical-interconnection element.

According to an embodiment, the first substrate further comprises a third plurality of electrical-interconnection elements housed at the first surface; and the second substrate further comprises a fourth plurality of electrical-interconnection elements) housed at the second surface, said assembly further comprising a second plurality of coupling elements, each coupling element of said second plurality of coupling elements extending between an electrical-interconnection element of the third plurality of electrical-interconnection elements and an electrical-interconnection element of the fourth plurality of electrical-interconnection elements, the coupling elements of the second plurality of coupling elements being ohmically coupled to an electrical-interconnection element of said third plurality of electrical-interconnection elements and ohmically coupled to an electrical-interconnection element of said fourth plurality of electrical-interconnection elements.

According to an embodiment, the first substrate and the second substrate are chosen from among: a substrate of a semiconductor chip; a substrate of a printed circuit; a substrate of a package for a microelectronic circuit.

According to an embodiment, there is provided, a method for assembly of a first substrate and a second substrate, comprising the steps of: providing a first substrate; forming, at a first surface of the first substrate, a first electrical-interconnection element and a second electrical-interconnection element; providing a second substrate; forming, at a second surface of the second substrate, a third electrical-interconnection element, and a fourth electrical-interconnection element; forming, above the third electrical-interconnection element, a dielectric layer; forming a first coupling element of conductive material between the first and third electrical-interconnection elements, at least partially aligned to the first and third electrical-interconnection elements along a direction orthogonal to the first surface and the second surface; forming a second coupling element of conductive material between the second electrical-interconnection element and the fourth electrical-interconnection element, at least partially aligned to the second and fourth electrical-interconnection elements along a direction orthogonal to the first surface and to the second surface; coupling the first coupling element ohmically to the first electrical-interconnection element and capacitively to the third electrical-interconnection element; and ohmically coupling the second coupling element to the second interconnection element and to the fourth interconnection element.

According to an embodiment, the step of capacitively coupling the first coupling element to the second electrical-interconnection element comprises arranging the first coupling element in contact with the dielectric layer at a portion of the dielectric layer facing the second electrical-interconnection element.

According to an embodiment, the steps of forming the first, second, third, and fourth electrical-interconnection elements comprise forming, respectively, a first conductive pad, a second conductive pad, a third conductive pad, and a fourth conductive pad.

According to an embodiment, the steps of forming the first and second coupling elements comprise forming a respective bump in contact with the first electrical-interconnection element and, respectively, with the second electrical-interconnection element.

According to an embodiment, the steps of coupling the first coupling element ohmically to the first electrical-interconnection element and capacitively to the third electrical-interconnection element, and the steps of ohmically coupling the second coupling element to the second electrical-interconnection element and to the fourth electrical-interconnection element comprise carrying out a thermal process at a temperature equal to or higher than the melting temperature of the first and second coupling elements.

According to an embodiment, the method further comprises the steps of forming, at the first surface, a first plurality of electrical-interconnection elements; forming, at the second surface, a second plurality of electrical-interconnection elements, the dielectric layer extending on top of the second plurality of electrical-interconnection elements; forming a first plurality of coupling elements between an electrical-interconnection element of said first plurality of electrical-interconnection elements and an electrical-interconnection element of said second plurality of electrical-interconnection elements; ohmically coupling each coupling element of said plurality of coupling elements to a respective electrical-interconnection element of said first plurality of electrical-interconnection elements; and capacitively coupling each coupling element of said plurality of coupling elements to a respective electrical-interconnection element of said second plurality of electrical-interconnection elements.

According to an embodiment, the method further comprise the steps of forming, at the first surface, a third plurality of electrical-interconnection elements; forming, at the second surface, a fourth plurality of electrical-interconnection elements; forming a second plurality of coupling elements between an electrical-interconnection element of said third plurality of electrical-interconnection elements and an electrical-interconnection element of said fourth plurality of electrical-interconnection elements; ohmically coupling each coupling element of said plurality of coupling elements to a respective electrical-interconnection element of said third plurality of electrical-interconnection elements and to a respective electrical-interconnection element of said fourth plurality of electrical-interconnection elements.

According to an embodiment, the method further comprises the steps of providing a first and a second controller configured for processing information data, providing a first and a second transceiver circuit, connecting the first controller to the first electrical-interconnection element by means of the first transceiver circuit, and connecting the second controller to the third electrical-interconnection element by means of the second transceiver circuit.

According to an embodiment, the step of providing the first and the second controller comprises integrating the first and the second controller within the first and, respectively, the second substrate.

According to an embodiment, the step of forming the second electrical-interconnection element comprises directly coupling the second electrical-interconnection element to the first controller, and the step of forming the fourth electrical-interconnection element comprises directly coupling the fourth electrical-interconnection element to the second controller.

BRIEF DESCRIPTION OF THE DRAWINGS

For a better understanding, embodiments are now described, purely by way of non-limiting example, with reference to the attached drawings, wherein:

FIG. 8 shows, in cross-sectional view, a 3D assembly of chips according to an embodiment; and FIG. 9 shows, in top plan view, a chip comprising pads arranged in a central portion and in a peripheral portion.

DETAILED DESCRIPTION

Figure 1:
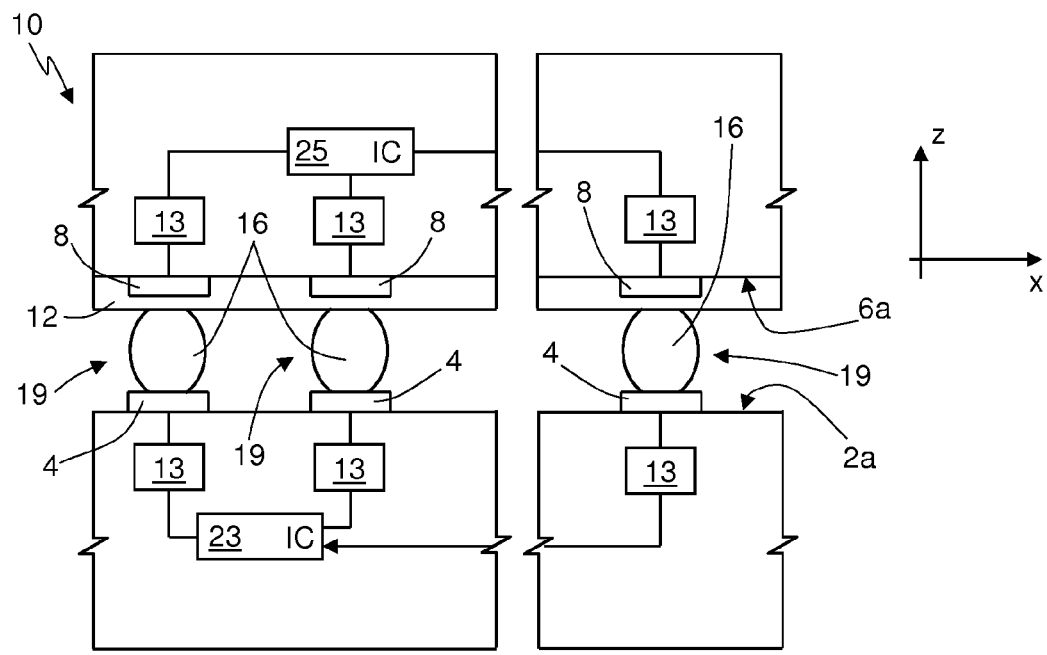
FIG. 1 shows, in cross-sectional view, an assembly of substrates capacitively coupled together, according to one embodiment.

FIG. 1 shows, in cross-sectional view, an assembly of two substrates according to an embodiment, forming, for example, an electronic device 10.

In detail, the electronic device 10 comprises a first substrate 2 and a second substrate 6, for example made of semiconductor material, such as silicon.

The first substrate 2 is provided with first conductive pads 4, formed on a surface 2a of the first substrate 2, and the second substrate 6 is provided with second conductive pads 8 formed on a surface 6a of the second substrate 6. FIG. 1 shows, by way of example, three first conductive pads 4 and three second conductive pads 8. It is evident that, according to the need, the first and second conductive pads 4, 8 can be in any number, higher or lower than three.

The second substrate 6 moreover includes a dielectric layer 12, formed on top of the surface 6a and on top of the second conductive pads 8. The dielectric layer 12 is, according to an embodiment, a passivation layer, for example made of silicon oxide, and has a thickness comprised between some hundreds of nanometers to some micrometers, for example 1 µm.

The first substrate 2 and the second substrate 6 are arranged with respect to one another so that the respective surfaces 2a and 6a face one another and the first pads 4 are at least partially aligned, in a vertical direction defined by the axis Z, to the respective second pads 8. In this way, respective first and second conductive pads 4, 8 face one another.

The first substrate 2 and the second substrate 6 are coupled by means of a plurality of coupling elements 16 made of conductive material, for example bumps, in particular solder bumps. The coupling elements 16 are, for example, made of metal, such as aluminium, copper, tin, lead, gold, or other metals still, or of a conductive alloy, for example gold/germanium (Au—Ge) or lead/tin (Pb—Sn) or tin/silver (Sn—Ag).

In particular, each coupling element 16 extends from each first conductive pad 4 (with which it is in electrical contact) until it contacts the dielectric layer 12 in a portion of the latter facing a respective second conductive pad 8.

Each first conductive pad 4 is consequently at least partially aligned, in the direction of the axis Z, to a respective coupling element 16 and to a respective second pad 8.

In detail, each first conductive pad 4 is in electrical contact with a respective coupling element 16, which is capacitively coupled to a respective second conductive pad 8. A capacitive interconnection 19 is thus formed, which can be represented schematically as a capacitor in which one capacitor plate is formed by the ensemble of a first pad 4 and of a coupling element 16, and the other capacitor plate is formed by a second pad 8. The dielectric extending between the plates of the capacitor is a portion of the dielectric layer 12 comprised between the coupling element 16 and the respective second conductive pad 8.

A capacitive coupling between each first pad 4 and a respective second pad 8 is thus formed.

The first and second substrates 2, 6 further comprise one or more receiver and transmitter circuits 13, each of which is electrically coupled to a respective conductive pad 4, 8 and is formed, for example, in integrated form in the respective first and second substrates 2, 6.

Each receiver and transmitter circuit 13 is a circuit of a known type, configured to enable communication in transmission and/or reception of information data (in digital or analog format) between the conductive pads 4, 8.

Each receiver and transmitter circuit 13 may be of a type configured to act both in transmission and in reception (also known as transceiver). A receiver and transmitter circuit 13 of this type may be, for example, of the type disclosed in US 2011/0171906.

Alternatively, some circuits 13 may be configured to act in transmission only, and other circuits 13 may be configured to act in reception only. The choice depends upon the particular application and use. It is evident that, if a certain circuit 13 integrated within the first substrate 2 is configured as a transmitter only, the circuit 13 integrated within the second substrate 6, and capacitively coupled with the transmitter circuit 13, is configured as a receiver, and vice versa. An interconnection system of this type is for example described in U.S. Pat. No. 7,821,293.

According to an embodiment, all the circuits 13 housed by the first substrate 2 are configured as transmission circuits; all the circuits 13 housed by the second substrate 6 are configured as receiving circuits. According to a further embodiment, all the circuits 13 housed by the first substrate 2 are configured as receiving circuits; all the circuits 13 housed by the second substrate 6 are configured as transmission circuits.

The first substrate 2 further comprises an electronic controller 23, e.g., formed in an integrated form within the substrate 2, connected to the conductive pads 4 via respective receiver and transmitter circuits 13, and configured for managing the information data exchanged between the conductive pads 4 and the conductive pads 8.

Likewise, also the substrate 6 comprises a respective electronic controller 25, connected to the conductive pads 8 via respective receiver and transmitter circuits 13, and configured for managing the information data exchanged between the conductive pads 4 and the conductive pads 8. The integrated circuits 23, 25 can in this way exchange information data via the capacitive coupling formed between the conductive pads 4 and the conductive pads 8.

Thanks to the presence of the dielectric layer 12, it is not necessary to provide the receiver and transmitter circuit 13 with diodes for protection from electrostatic discharge (ESD diodes).

The electronic controller 23 is configured to process, in way which is not an object of the present disclosure, information data received by the electronic controller 25, and/or to process information data to be sent to the electronic controller 25. Analogously, the electronic controller 25 is configured to process, in way which is not an object of the present disclosure, information data received by the electronic controller 23, and/or to process information data to be sent to the electronic controller 23. Information data are exchanged, for example in a digital format, through the receiver and transmitter circuits 13 coupled to the respective electronic controllers 23, 25. The receiver and transmitter circuits 13 housed by the first substrate 2 and the receiver and transmitter circuits 13 housed by the second substrate 6 are capacitive-coupling transceivers (as said, of a known type), allowing capacitive data exchange among them. Each receiver and transmitter circuit 13 of the first substrate 2 is thus configured to capacitively receive/transmit data from/to a respective receiver and transmitter circuits 13 of the second substrate 6, through respective conductive pads 4, 8 and coupling elements 16. Communication of data between electronic controllers 23 and 25 is, in this way, guaranteed.

Figure 2A:
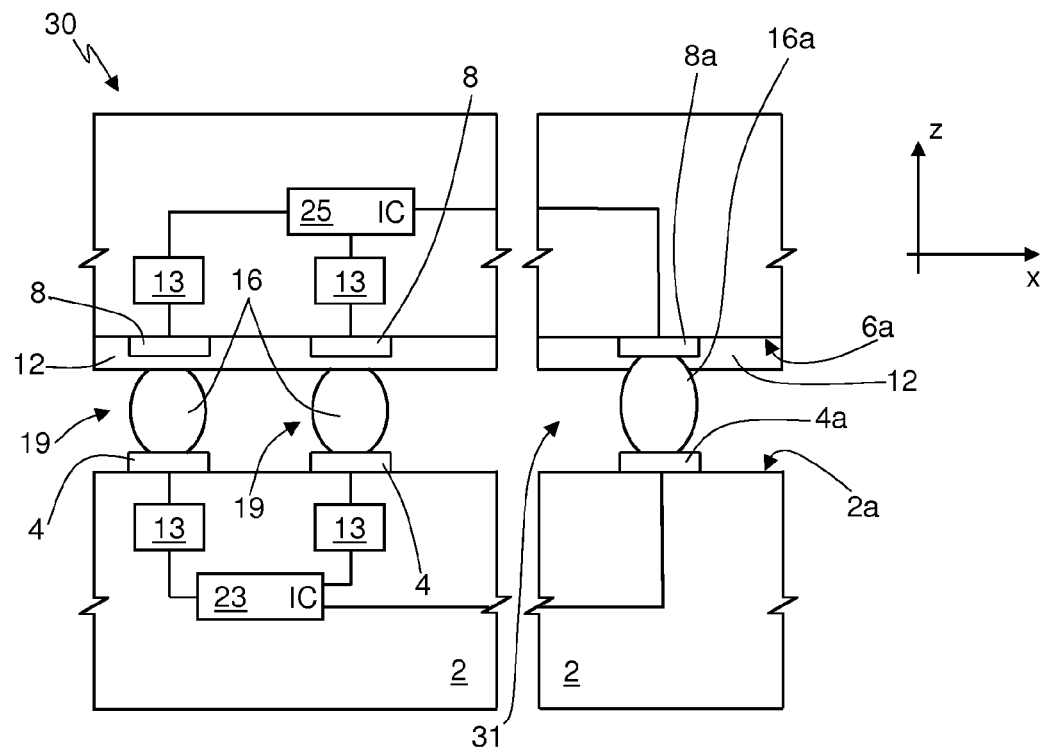
FIG. 2a shows, in cross-sectional view, an assembly of substrates coupled together capacitively and ohmically, according to another embodiment.

FIG. 2a shows, in cross-sectional view, an assembly of two substrates according to a further embodiment. The assembly of FIG. 2a forms, for example, an electronic device 30.

The electronic device 30 is similar to the electronic device 10 of FIG. 1 (elements that are in common are not described any further and are designated in the figure by the same reference numbers), and comprises, in addition to the capacitive interconnections 19, an ohmic interconnection 31. It is evident that the number of capacitive interconnections 19 and ohmic interconnections 31 can be different from the one shown in FIG. 2a. In particular, there may be present capacitive interconnections 19 in a number higher or lower than two, and ohmic interconnections 31 in number higher than one.

The ohmic interconnection 31 is formed by means of a coupling element 16a similar to the coupling elements 16, for example a conductive bump (of the solder-bump type). The coupling element 16a extends between a first conductive pad 4a (similar to the first conductive pads 4) and a respective second conductive pad 8a (similar to the second conductive pads 8), which faces the first conductive pad 4a and is aligned thereto in a direction parallel to the axis Z. The coupling element 16a is in ohmic contact both with the first conductive pad 4a and with the second conductive pad 8a, and can be used for transfer of information signals and/or for transfer of direct current (DC) biasing signals, and/or for transfer of the supply between the first and second substrates 4, 6. For this purpose, a connection may be provided between the electronic circuits 23, 25 via the coupling element 16a.

Figure 2B:
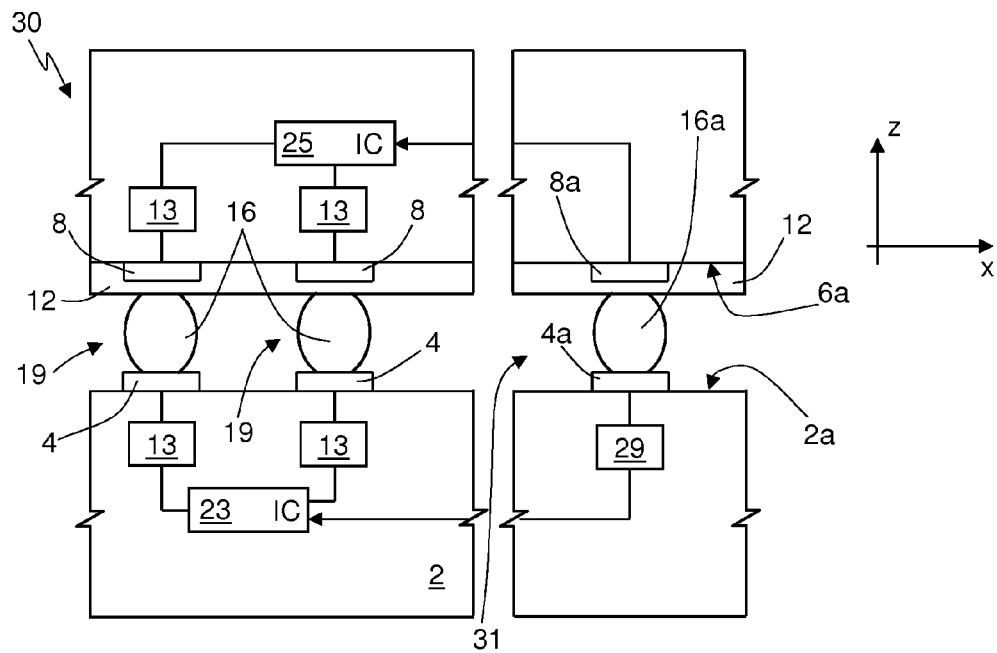
FIG. 2b shows, in cross-sectional view, an assembly of substrates coupled together capacitively and ohmically, according to a further embodiment.

According to an embodiment, as shown in FIG. 2b, the capacitive interconnections 19 are used for communication of information data using alternate current (AC) signals, and the ohmic interconnection 31 is used for DC supply. The first substrate 2 further comprises a power supply 29, formed in integrated form in the first substrate 2, configured for supplying the electronic controller 23 and the electronic controller 25. Supply to the electronic controller 25 is provided via the ohmic interconnection 31.

Alternatively, in a way not shown in the figure, the power supply 29 is external to the first substrate 2 and to the second substrate 6. With reference to FIGS. 3a, 3b, 4-6, there are now described process steps for the manufacture of the assembly that forms the electronic device 30 of FIG. 2a (or 2b).

Figure 3A:
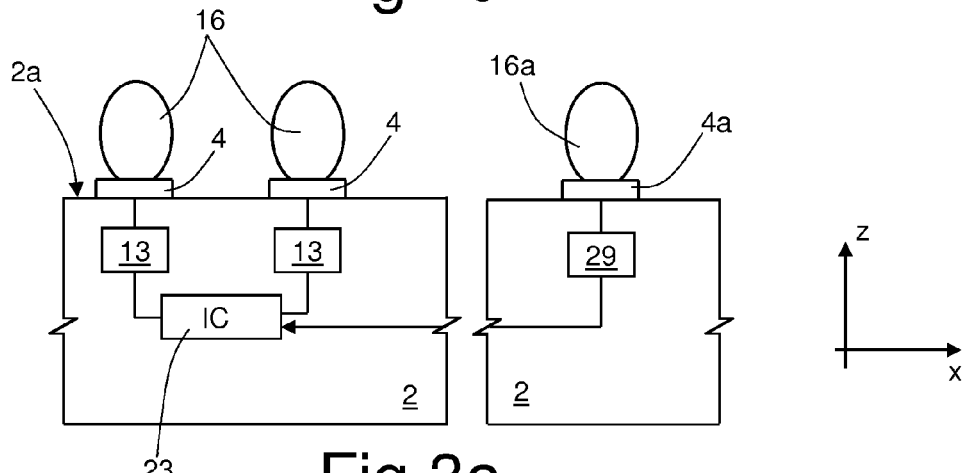
FIGS. 3a, 3b, and 4-6 show steps of formation of the assembly of FIG. 2a or FIG. 2b.
Figure 3B:
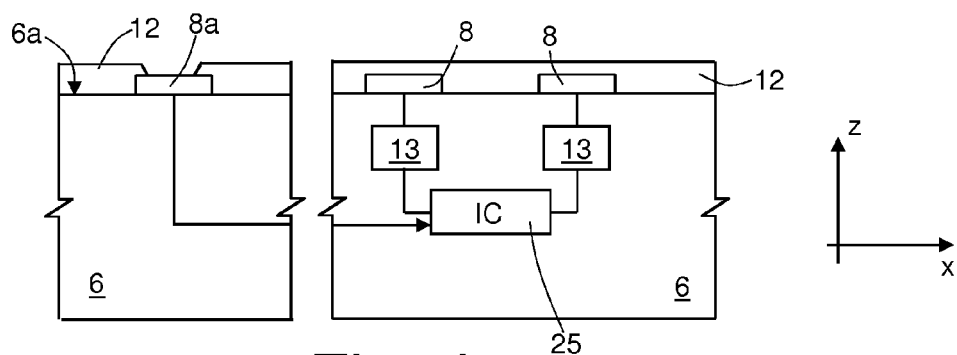
Figure 4:
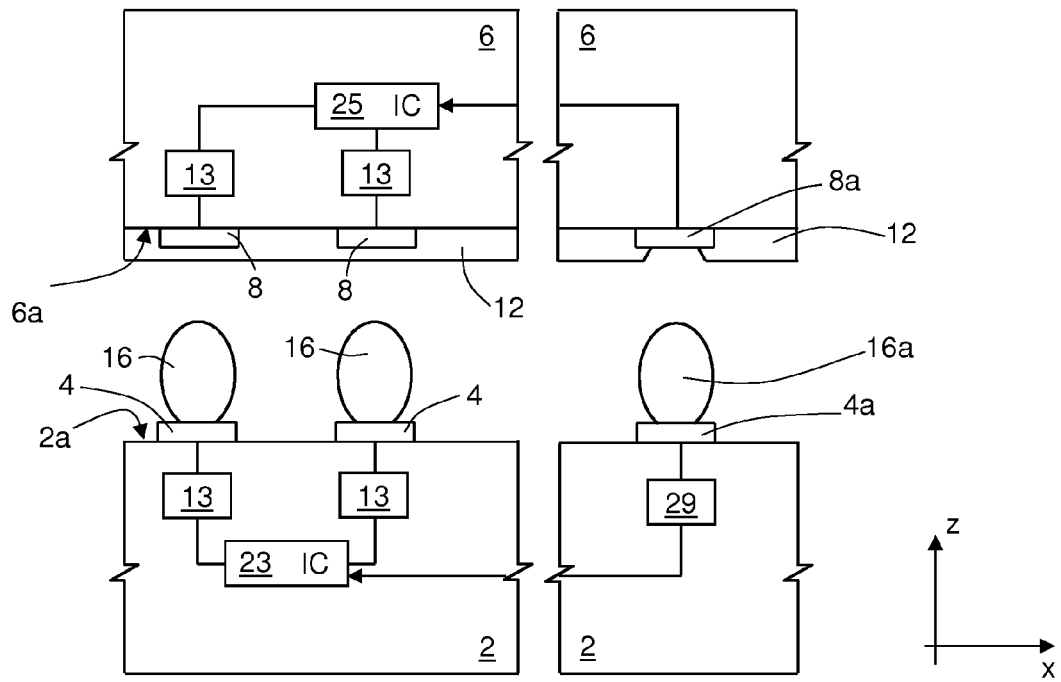
Figure 5:
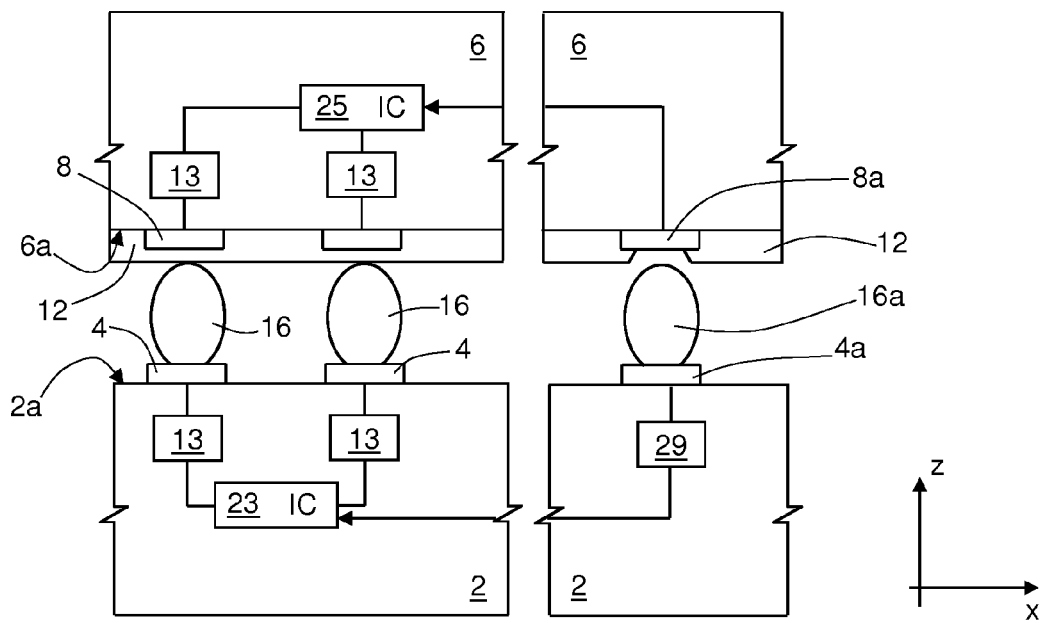

FIGS. 3a and 3b show the first and second substrates 2, 6 at the end of respective machining steps. In this step, the first and second substrates 2, 6 are substrates machined independently of one another, and in particular comprising a plurality of layers of materials deposited and/or grown, according to known micromachining techniques. The surfaces 2a and 6a are consequently the surfaces resulting at the end of respective steps of machining of the substrates 2, 6. In particular, the surfaces 2a, 6a comprise respective conductive pads 4, 4a, 8, 8a, arranged in such a way as to enable interconnection of the substrates 2, 6 as described previously with reference to FIG. 2a.

It is evident that the substrates 2, 6 can be, indifferently, semiconductor substrates of respective chips, or substrates of printed circuit boards (PCBs), or again, package substrates designed to carry a chip provided with bump connections and coupled to the chip via the bumps themselves, or the like.

The second substrate 6 comprises, as has been said, a dielectric layer 12 formed on the second conductive pads 8 but not on the second conductive pad 8a.

The first substrate 2 houses, in a position corresponding to the first conductive pads 4, the coupling elements 16, and, in a position corresponding to the first pad 4a, the coupling element 16a. The coupling elements 16, 16a are, according to one embodiment, metal bumps (solder bumps or pillar bumps) that are the same as one another and formed in one and the same process step.

Techniques for formation of bumps are known in the literature, for example from U.S. Pat. No. 5,477,933.

Then (FIG. 4), the first and second substrates 2, 6 are arranged with the respective surfaces 2a and 6a facing one another (flip-chip technique) so that the second conductive pads 8, 8a are aligned, along the axis Z, with the coupling elements 16 and 16a, respectively.

Then (FIG. 5), the second substrate 6 is brought up to the first substrate 2 (or vice versa) so that the coupling elements 16 are arranged in contact with the dielectric layer 12. In this step, the coupling element 16a might not be in contact with the respective second conductive pad 8a on account of the thickness of the dielectric layer 12.

Finally (FIG. 6), the first and second substrates 2, 6 are arranged in an environment having, for example, a temperature slightly higher than the temperature of melting of the coupling elements 16 and 16a, and such as to cause a partial melting of the coupling elements 16 and 16a (also known as "reflow"). Generally, for coupling elements 16, 16a made of Pb—Sn, the melting temperature is approximately 310° C.

During the reflow step a partial realignment and rearrangement of the first and second substrates 2, 6 is generated, which, as a result of the partial melting of the coupling elements 16 and 16a, approach along the axis Z, thus reducing the relative distance between the surfaces 2a, 6a. In this way, also the coupling element 16a contacts the second conductive pad 8a.

The applicant has verified that, since the thickness of the dielectric layer 12 is small (as has been said, for example 1 µm), the mutual rearrangement between the substrates 2, 6 during the reflow step is sufficient to fill the distance possibly present between the coupling element 16a and the second conductive pad 8a.

What has been said applies in general also in the case where, owing to process spread, some of the coupling elements 16 have a thickness smaller than other coupling elements 16. The mutual rearrangement of the substrates 2, 6 during the reflow step also enables a good contact to be obtained between the coupling elements 16 and the dielectric layer 12.

Clearly, the temperature and the duration of the reflow step is accurately controlled, as is known from the prior art, and none of the coupling elements 16 melts completely.

Figure 6:
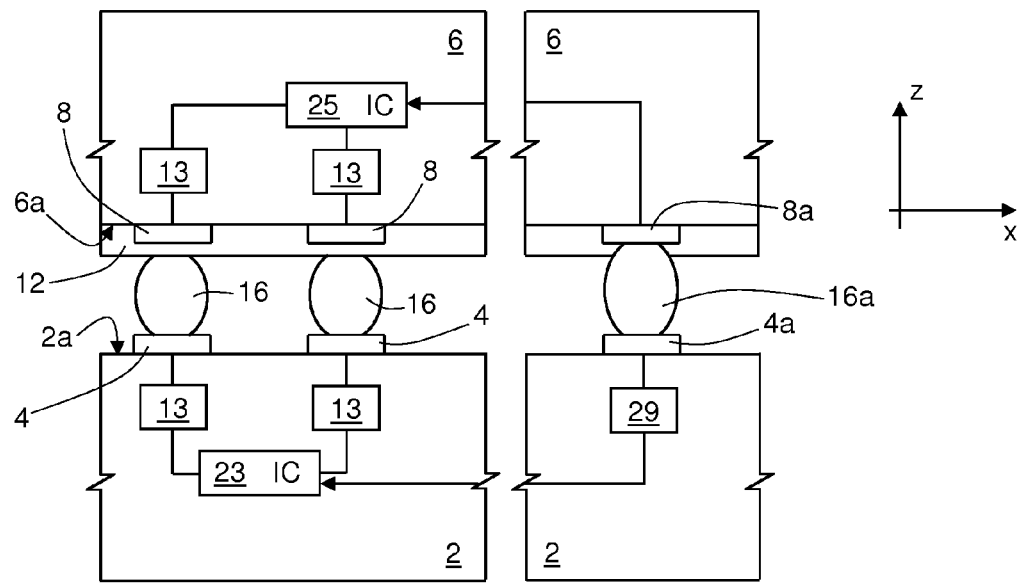

As an alternative to what has been described with reference to the steps of FIG. 6, the thermal process can be replaced by or associated with a process of pressure bonding.

The electronic device of FIG. 2a is thus formed.

Figure 7:
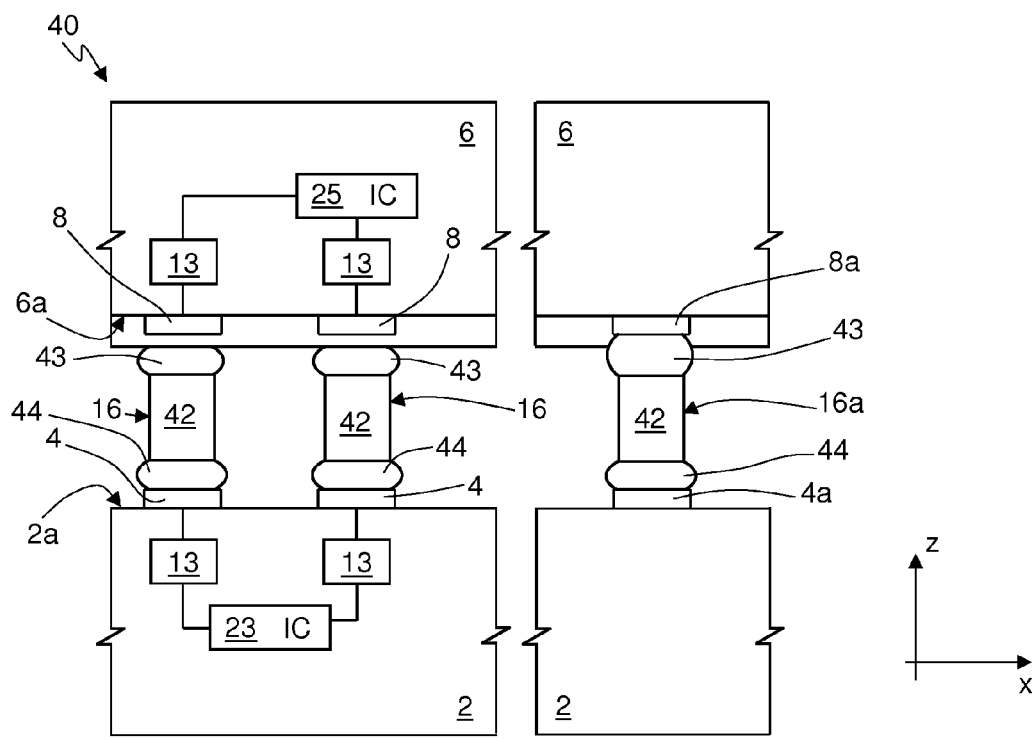
FIG. 7 shows, in cross-sectional view, an assembly of substrates coupled together capacitively and ohmically, according to a further embodiment.

FIG. 7 shows an electronic device 40 according to a further embodiment.

According to the embodiment of FIG. 7, the coupling elements 16 (and the coupling element 16a when present) are pillar bumps. Elements common to the embodiments of FIG. 1 and FIG. 2a are not described any further and are designated by the same reference numbers.

The coupling elements 16, 16a in the form of pillar bumps comprise a bearing structure 42, typically made of copper, having a thickness of some tens of micrometers, at the opposite ends of which coupling regions 43 and 44 are formed, typically of a lead/tin or tin/silver alloy or UBM (under bump metallization). The coupling regions 43, 44 are designed to favour adhesion (typically by means of welding) of each coupling element 16, 16a with the first and second conductive pads 4, 4a, 8, 8a. During the reflow step, as described previously with reference to FIG. 6, the coupling regions 43, 44 melt in a controlled way so as to enable a reduction of the distance that separates the surfaces 2a and 6a along the axis Z such as to bring the coupling elements 16 into direct contact with the dielectric layer 12 and the coupling element 16 to the second metal pad 8a. Melting moreover has the purpose of favouring adhesion between the coupling regions 43, 44 and the conductive pads 4, 4a, 8a with which they are in contact, as well as favouring a good capacitive coupling between the coupling regions 43 and the dielectric layer 12.

An advantage of using pillar bumps instead of solder bumps lies in the fact that, as is known, it is possible to form pillar bumps having relative lateral distance (along the axis X) smaller than the distance required by the solder bumps. The pillar bumps present, however, the disadvantage of requiring more complex manufacturing steps and generating parasitic capacitors between adjacent pillar bumps having parasitic capacitance higher than what occurs in the case of solder bumps.

As shown in FIG. 8, the assembly finds application in the 3D integration of chips. For example, FIG. 8 shows a first chip 101, a second chip 102, and a third chip 103 capacitively coupled together by means of a plurality of coupling elements of the type described previously. Furthermore, the chips 101-103 comprise one or more coupling elements designed to form an ohmic electrical coupling, for example for electrical supply of the chips 101-103.

To protect the surfaces facing one another of each chip 101-103, the chips 101-103 comprise a respective passivation layer, extending all over the surface of the chips 101-103 except for the conductive pads, where a coupling of an ohmic type is envisaged.

In detail, the chip 101 comprises a semiconductor substrate 111 having a surface 111a and housing a plurality of conductive pads 118, 118a in a position corresponding to the surface 111a. Moreover extending on the surface 111a is a passivation layer 112, made of dielectric material, having a thickness for example of 1 µm. The passivation layer 112 covers the conductive pads 118 but not the conductive pad 118a. The conductive pads 118 are configured to enable a capacitive coupling between the chip 101 and the chip 103, whilst the conductive pad 118a is configured to enable an ohmic coupling between the chip 101 and the chip 103.

The substrate 111, in a way similar to what has already been described with reference to the substrate 6 of FIGS. 1, 2a, 2b, can comprise a plurality of integrated electronic circuits, connected to each conductive pad 118 to enable reception and/or transmission of information signals in capacitive mode, and a supply circuit, connected to the conductive pad 118a for picking up the supply signal.

The chip 103 comprises a substrate 113, for example made of semiconductor material, housing, in a position corresponding to a surface 113a, a plurality of conductive pads 114, 114a, 114b. Moreover extending on the surface 113a of the substrate 113 is a passivation layer 120, for protecting the surface 113a. The passivation layer 120 leaves the conductive pads 114, 114a, 114b exposed.

As has been described with reference to the chip 101, also the substrate 113 comprises a plurality of integrated electronic circuits, connected to each conductive pad 114 to enable reception and/or transmission of information signals, and an electrical-supply circuit.

The chips 101 and 103 are arranged with respect to one another so that the respective surfaces 111a, 113a face one another.

The coupling between the chip 101 and the chip 103 is provided by means of a plurality of coupling elements 116, 116a, for example solder bumps, as described with reference to FIGS. 3-6.

The coupling elements 116 extend between each conductive pad 114 of the chip 103 up to the passivation layer 112 of the chip 101, in ohmic electrical contact with the pad 114 and in contact with a portion of the passivation layer 112 where a respective conductive pad 118 of the chip 101 extends. In this way, each conductive pad 114 is capacitively coupled to a respective conductive pad 118 via the coupling element 116.

The coupling element 116a extends between the conductive pad 114a of the chip 103 and the conductive pad 118a of the chip 101, in ohmic electrical contact both with the conductive pad 114a and with the conductive pad 118a. The coupling element 116a can be used both for transfer of information signals and for electrical supply.

The third chip 103 is moreover arranged on a substrate 105, for example a substrate 105 of a package (not shown). The third chip 103 is electrically connected to the substrate 105 by means of wire bonding 106, extending between the conductive pads 114b and respective conductive pads of the substrate 105.

Alternatively, in a way not shown in the figure, also the third chip 103 and the substrate 105 can be capacitively coupled and/or electrically coupled to one another by means of coupling elements of a solder-bump or pillar-bump type. In this case, the third chip 103 has a plurality of through-silicon vias (TSVs), designed to form a connection between opposite faces of the chip 103, rendering 3D integration of the chips particularly compact.

The second chip 102 is provided with a semiconductor substrate 112 of its own, and is connected to the third chip 103 in a way similar to what has been described with reference to the first chip 101, and will hence not be described any further.

FIG. 9 shows, in schematic form and in top plan view, conductive pads 114, 114a arranged in a position corresponding to the surface 111a of the chip 101. However, what has been said here applies to all the chips 101-103.

With reference to FIG. 9, the chip 101 comprises a central portion 201 surrounded by a peripheral portion 202. In particular, one or more conductive pads can be arranged within the central portion 201, and be in any case easily accessible by means of capacitive connection. Other pads can be arranged in a position corresponding to the peripheral portion 202. The possibility of using the central portion 201 proves particularly advantageous in chips or integrated circuits of a pad-limited type, in which the number of conductive pads that can be provided in the peripheral portion 202 of the chip 101 is limited.

From an examination of the characteristics of the invention obtained according to the present disclosure the advantages that it affords are evident.

In particular, embodiments enable a considerable saving of area of the substrates used in so far as conductive bumps can be formed in any region of the substrate, in particular positions corresponding to the conductive pads. In this way, the bumps have at the same time the function of mechanical supporting elements and the function of contact electrical coupling elements (the bumps ohmically connected to the respective pads) or contactless electrical coupling elements (the bumps capacitively connected to the respective pads).

Furthermore, the manufacturing process is compatible with standard CMOS processes.

Furthermore, the use of capacitive interconnections enables limitation of the use of electrostatic-discharge (ESD) protection elements, which occupy space and limit the performance of the device. The absence of ESD protection elements also enables reduction of the consumption levels.

Finally, it is clear that modifications and variations may be made to the invention described and illustrated herein, without thereby departing from the sphere of protection of the present invention, as defined in the annexed claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An assembly comprising:
a first substrate, having a first surface, housing a first electrical-interconnection element and a second electrical-interconnection element at the first surface;
a second semiconductor substrate, having a second surface, housing a third electrical-interconnection element and a fourth electrical-interconnection element at the second surface, and provided with a dielectric layer extending across a region of the second surface and covering the third electrical-interconnection element, wherein the dielectric layer is spaced apart from the first substrate by air;
an opening in the dielectric layer formed at the fourth electrical-interconnection element;
a first coupling element comprising conductive solder, extending between the first electrical-interconnection element and the third electrical-interconnection element and at least partially aligned to the first electrical-interconnection element and to the third electrical-interconnection element; and
a second coupling element of conductive material, extending between the second electrical-interconnection element and the fourth electrical-interconnection element, at least partially aligned to the second and to the fourth electrical-interconnection elements,
the first coupling element being ohmically coupled to the first electrical-interconnection element and capacitively coupled to the third electrical-interconnection element, and the second coupling element being ohmically coupled to the second electrical-interconnection element and to the fourth electrical-interconnection element.

2. The assembly according to claim 1, wherein the first coupling element is arranged in electrical contact with the first electrical-interconnection element and in direct contact with a portion of the dielectric layer facing the third electrical-interconnection element.

3. The assembly according to claim 1, wherein the first coupling element and the second coupling element are bumps, in particular solder bumps or pillar bumps.

4. The assembly according to claim 1, wherein the first, second, third, and fourth electrical-interconnection elements are pads of conductive material.

5. The assembly according to claim 1, wherein the first substrate houses a first integrated circuit connected to the first electrical-interconnection element, the second semiconductor substrate houses a second integrated circuit connected to the third electrical-interconnection element, the first and second integrated circuits being capacitively coupled together by means of the first electrical-interconnection element, the first coupling element, and the third electrical-interconnection element.

6. The assembly according to claim 5, wherein the first integrated circuit includes a first controller configured for processing information data, and a first transceiver circuit connecting the first controller to the first electrical-interconnection element; and wherein the second integrated circuit includes a second controller configured for processing information data, and a second transceiver circuit connecting the second controller to the third electrical-interconnection element.

7. The assembly according to claim 6, wherein the first and second transceiver circuits are formed in integrated form in the respective first substrate and second semiconductor substrates.

8. The assembly according to claim 6, wherein the first and second transceiver circuits are configured to enable communication in transmission and/or reception of information data in digital or analog format between the first and the second integrated circuits through the first electrical-interconnection element, the first coupling element, and the third electrical-interconnection element.

9. The assembly according to claim 8, wherein the first and second transceiver circuits are capacitive-coupling transceivers.

10. The assembly according to claim 6, wherein the second electrical-interconnection element is directly coupled to the first controller, and the fourth electrical-interconnection element is directly coupled to the second controller.

11. The assembly according to claim 1, wherein the first electrical-interconnection element and the first coupling element form a first capacitor plate, and the third electrical-interconnection element forms a second capacitor plate, the dielectric layer forming a dielectric disposed between the first and second capacitor plates.

12. The assembly according to claim 1, wherein the second electrical-interconnection element, the second coupling element, and the fourth electrical-interconnection element are configured for transferring a DC signal between the first and second substrates.

13. The assembly according to claim 1, wherein the first substrate further comprises a first plurality of electrical-interconnection elements housed at the first surface; the second semiconductor substrate further comprises a second plurality of electrical-interconnection elements housed at the second surface, the dielectric layer covering said second plurality of electrical-interconnection elements, said assembly further comprising a first plurality of coupling elements, each coupling element of the first plurality of coupling elements extending between an electrical-interconnection element of the first plurality of electrical-interconnection elements on the first substrate and an electrical-interconnection element of the second plurality of electrical-interconnection elements on the second semiconductor substrate, and being ohmically coupled to the respective electrical-interconnection element of the first plurality of electrical-interconnection elements on the first substrate and capacitively coupled to the respective electrical-interconnection element of the second plurality of electrical-interconnection elements on the second semiconductor substrate.

14. The assembly according to claim 13, wherein the first substrate further comprises a third plurality of electrical-interconnection elements housed at the first surface of the first substrate; and the second semiconductor substrate further comprises a fourth plurality of electrical-interconnection elements housed at the second surface of the second semiconductor substrate, said assembly further comprising a second plurality of coupling elements, each coupling element of said second plurality of coupling elements extending between an electrical-interconnection element of the third plurality of electrical-interconnection elements and an electrical-interconnection element of the fourth plurality of electrical-interconnection elements, the coupling elements of the second plurality of coupling elements being ohmically coupled to an electrical-interconnection element of said third plurality of electrical-interconnection elements and ohmically coupled to an electrical-interconnection element of said fourth plurality of electrical-interconnection elements.

15. The assembly according to claim 1, wherein the first substrate and the second semiconductor substrate are chosen from among: a substrate of a semiconductor chip; a substrate of a printed circuit; a substrate of a package for a microelectronic circuit.

16. An assembly comprising:
a first substrate, having a first surface;
a first electrical-interconnection element formed at the first surface;
a second electrical-interconnection element formed at the first surface;
a second semiconductor substrate, having a second surface facing the first surface;
a third electrical-interconnection element formed at the second surface;
a dielectric layer formed on a region of the second surface, spaced apart from the first substrate by air and covering the third electrical-interconnection element;
a fourth electrical-interconnection element formed at the second surface;
an opening in the dielectric layer formed at the fourth electrical-interconnection element;
a first coupling element comprising conductive solder, ohmically contacting the first electrical-interconnection element and capacitively coupled to the third electrical-interconnection element; and
a second coupling element comprising conductive solder, extending between the second electrical-interconnection element and the fourth electrical-interconnection element.

17. The assembly of claim 16, wherein the first coupling element and second coupling element are formed as solder bumps or solder pillars.

18. The assembly of claim 16, wherein the first substrate comprises a substrate of a semiconductor chip, a substrate of a printed circuit, or a substrate of a package for a microelectronic circuit.

19. The assembly of claim 16, wherein the first coupling element directly contacts the first electrical-interconnection element and the dielectric layer and the second coupling element directly contact the second electrical-interconnection element and the fourth electrical-interconnection element.

20. The assembly of claim 16, further comprising:
a first integrated circuit formed at the first substrate and connected to the first electrical-interconnection element; and
a second integrated circuit formed at the second substrate and connected to the second electrical-interconnection element.

21. The assembly of claim 20, wherein the first integrated circuit comprises:
a first controller configured to process digital or analog signals; and
a first transceiver in communication with the first controller and configured to transmit and receive signals through the first electrical-interconnection element.

22. The assembly of claim 21, wherein the second integrated circuit comprises:
a second controller configured to process digital or analog signals; and a second transceiver in communication with the second controller and configured to transmit and receive signals through the third electrical-interconnection element.

23. The assembly of claim 22, wherein the first transceiver and second transceiver are capacitively coupled through the dielectric layer.

24. The assembly of claim 16, wherein a thickness of the dielectric layer is approximately one micron.

* * * * *